(12) United States Patent
Ishikura et al.

(10) Patent No.: US 10,199,391 B2
(45) Date of Patent: Feb. 5, 2019

(54) SEMICONDUCTOR DEVICE AND METHOD OF MANUFACTURING THE SAME

(71) Applicant: Toshiba Memory Corporation, Tokyo (JP)

(72) Inventors: Taishi Ishikura, Kawasaki Kanagawa (JP); Atsunobu Isobayashi, Yokohama Kanagawa (JP); Masayuki Kitamura, Yokkaichi Mie (JP); Akihiro Kajita, Tsukuba Ibaraki (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/688,646

(22) Filed: Aug. 28, 2017

(65) Prior Publication Data
US 2018/0261624 A1 Sep. 13, 2018

(30) Foreign Application Priority Data
Mar. 10, 2017 (JP) .................................. 2017-046189

(51) Int. Cl.
| H01L 27/11582 | (2017.01) |
| H01L 27/11568 | (2017.01) |
| H01L 27/11551 | (2017.01) |
| H01L 29/792 | (2006.01) |
| H01L 27/11556 | (2017.01) |
| H01L 27/11575 | (2017.01) |
| H01L 27/11565 | (2017.01) |
| H01L 29/66 | (2006.01) |
| H01L 27/11573 | (2017.01) |
| H01L 27/11553 | (2017.01) |
| H01L 27/11578 | (2017.01) |

(52) U.S. Cl.
CPC .. *H01L 27/11582* (2013.01); *H01L 27/11551* (2013.01); *H01L 27/11553* (2013.01); *H01L 27/11556* (2013.01); *H01L 27/11565* (2013.01); *H01L 27/11568* (2013.01); *H01L 27/11573* (2013.01); *H01L 27/11575* (2013.01); *H01L 27/11578* (2013.01); *H01L 29/66833* (2013.01); *H01L 29/7926* (2013.01)

(58) Field of Classification Search
None
See application file for complete search history.

(56) References Cited

U.S. PATENT DOCUMENTS

| 5,760,475 A | 6/1998 | Cronin et al. |
| 8,358,008 B2 | 1/2013 | Wada et al. |
| 9,147,468 B1 * | 9/2015 | Lue ..................... G11C 11/5671 |

(Continued)

FOREIGN PATENT DOCUMENTS

| JP | 2011-023420 | 2/2011 |
| JP | 2015-061042 | 3/2015 |

*Primary Examiner* — Minh-Loan Tran
(74) *Attorney, Agent, or Firm* — Patterson & Sheridan, LLP

(57) ABSTRACT

A semiconductor device includes an under layer, a stacked body comprising a plurality of conductive layers and insulating layers alternately stacked one over the other in a stacking direction, above the insulating layer, a columnar portion extending into the stacked body in the stacking direction of the stacked body, and a graphene film between at least one of the conductive layers and adjacent insulating layers and between the at least one of the conductive layers and the columnar portion.

7 Claims, 18 Drawing Sheets

(56) References Cited

U.S. PATENT DOCUMENTS

| | | |
|---|---|---|
| 9,324,634 B2 | 4/2016 | Bao et al. |
| 9,472,450 B2 | 10/2016 | Bonilla et al. |
| 2013/0134377 A1* | 5/2013 | Park .................. H01L 45/06 257/4 |
| 2017/0117290 A1* | 4/2017 | Lee ................ H01L 27/11582 |

* cited by examiner

SEMICONDUCTOR DEVICE AND METHOD OF MANUFACTURING THE SAME

CROSS-REFERENCE TO RELATED APPLICATION

This application is based upon and claims the benefit of priority from Japanese Patent Application No. 2017-046189; filed Mar. 10, 2017, the entire contents of which are incorporated herein by reference.

FIELD

Embodiments described herein relate generally to a semiconductor device and a method of manufacturing the same.

BACKGROUND

As a method of forming an electrode layer functioning as a control gate of a three-dimensional memory device, there has been proposed a method of forming a conductive layer in a gap formed between insulating layers via a barrier film.

DETAILED DESCRIPTION

Figure 1:
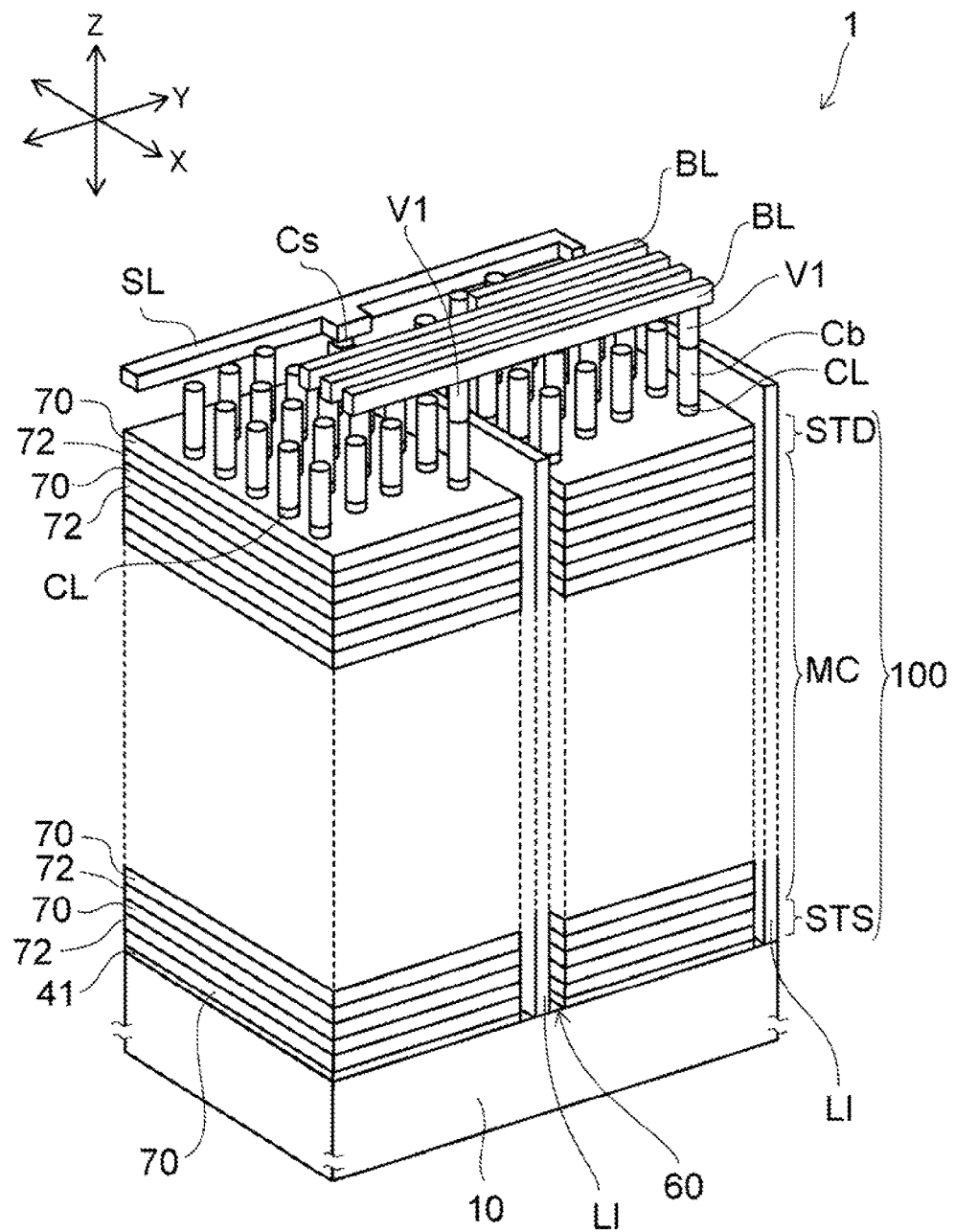
FIG. 1 is a schematic perspective view of a semiconductor device according to an embodiment.

Embodiments provide a semiconductor device in which a thin barrier film is present between a conductive layer and an insulating layer and between a conductive layer and a columnar portion, and a method of manufacturing the same.

In general, according to one embodiment, a semiconductor device includes an under layer, a stacked body comprising a plurality of alternating conductive layers and insulating layers stacked one over the other in a stacking direction, above the insulating layer, a columnar portion extending into the stacked body in the stacking direction of the stacked body, and a graphene film between at least one of the conductive layers and adjacent insulating layers and between the at least one of the conductive layers and the columnar portion.

An embodiment will be described below with reference to the accompanying drawings. In each of the drawings, the same elements are denoted by the same reference numerals.

As an example of a semiconductor device in the embodiment, a semiconductor memory device having a three-dimensional structure memory cell array will be described.

FIG. 1 is a schematic perspective view of a memory cell array 1 according to the embodiment.

In FIG. 1, two directions parallel to a main surface of a substrate 10 and orthogonal to each other are defined as an X-direction and a Y-direction, and a direction orthogonal to both the X-direction and the Y-direction is defined as a Z-direction (which, in the illustrations, is the stacking direction).

The memory cell array 1 includes a substrate 10, a stacked body 100 on the main surface of the substrate 10, a plurality of columnar portions CL, a plurality of dividing portions 60, and an upper layer interconnect provided above the stacked body 100. In FIG. 1, for example, a bit line BL and a source line SL are illustrated as the upper layer interconnect.

The columnar portion CL is formed in a substantially columnar shape extending in the stacking direction (Z-direction) in the stacked body 100. The dividing portion 60 has an interconnect portion LI extending in the stacking direction (depicted as the Z-direction) and the X-direction in the stacked body 100, and divides the stacked body 100 into a plurality of blocks (or fingers) in the Y-direction.

The plurality of columnar portions CL are disposed, for example, in a staggered arrangement. Alternatively, the plurality of columnar portions CL may be disposed in a square grid pattern in the X-direction and the Y-direction.

A plurality of bit lines BL are provided above the stacked body 100. The plurality of bit lines BL are, for example, metal films extending in the Y-direction. The plurality of bit lines BL are spaced apart from one another in the X-direction.

At an upper end of a semiconductor body, which will be described below, the columnar portion CL is connected to the bit line BL via contact portions Cb and V1. A plurality of columnar portions CL are connected to one common bit line BL. The plurality of columnar portions CL connected to the common bit line BL include a single columnar portion CL from each respective block spaced apart in the Y-direction by the dividing portion 60.

Figure 2:
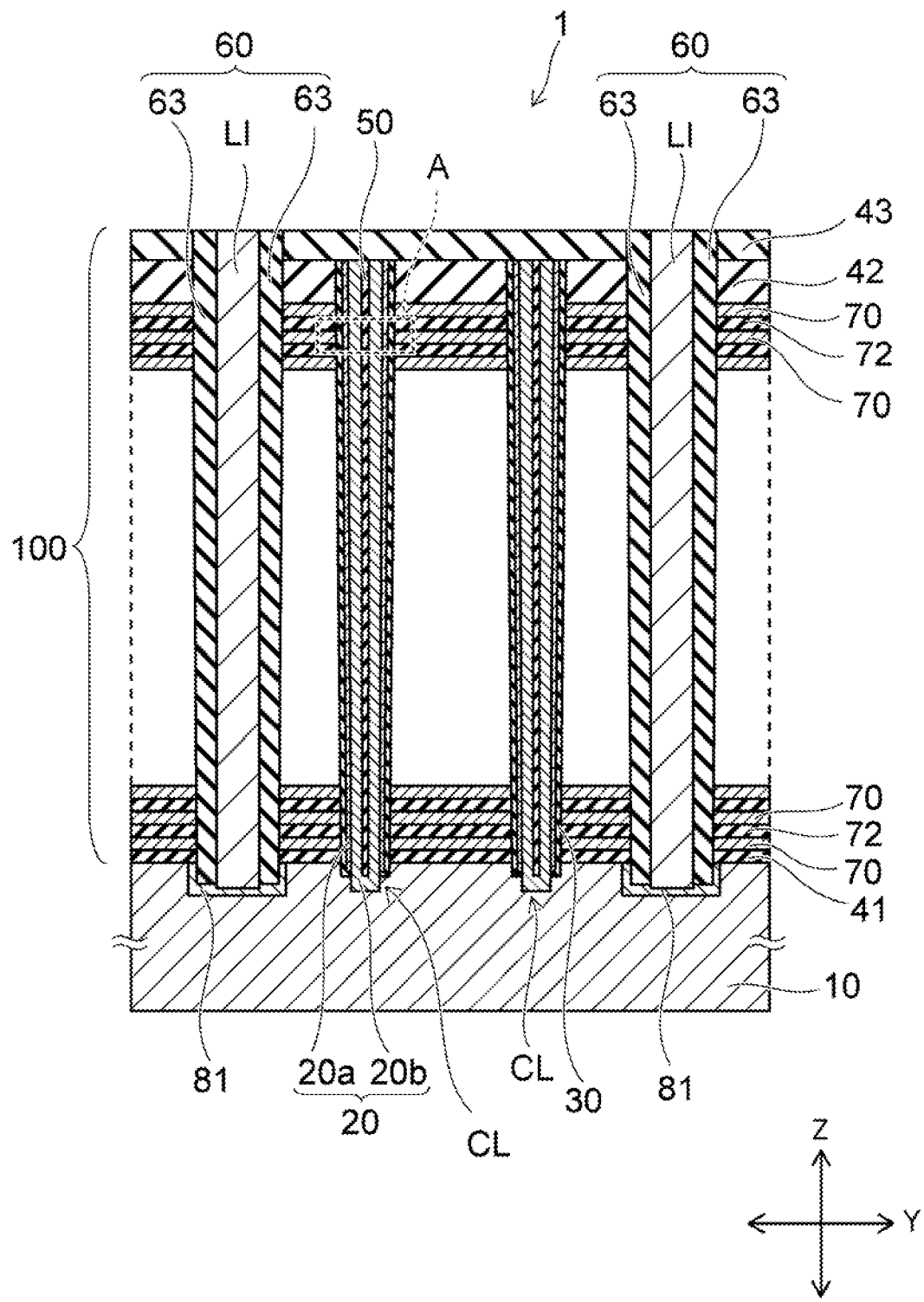
FIG. 2 is a schematic cross-sectional view of the semiconductor device according to the embodiment.

FIG. 2 is a schematic cross-sectional view of the memory cell array 1. The Y-direction and the Z-direction illustrated in FIG. 2 correspond to the Y-direction and the Z-direction illustrated in FIG. 1, respectively.

The stacked body 100 has a plurality of conductive layers 70 stacked one over the other on the main surface of the substrate 10 as an under layer thereof. The plurality of conductive layers 70 are stacked in the direction perpendicular to the main surface of the substrate 10 (depicted as the Z-direction) with an insulating layer 72 interposed between the conductive layers 70. The conductive layer 70 is a metal layer, for example, a tungsten layer or a molybdenum layer.

An insulating film 41 is provided between the main surface of the substrate 10 and the lowermost conductive layer 70. An insulating film 42 is provided on the uppermost conductive layer 70, and an insulating film 43 is provided on the insulating film 42.

The columnar portion CL includes a memory film 30, a semiconductor body 20, and an insulating core film 50. The semiconductor body 20, the memory film 30, and the core film 50 continuously extend in the stacking direction of the stacked body 100.

The semiconductor body 20 extends like a pipe in the stacking direction in the stacked body 100. The memory film 30 is provided between the conductive layer 70 and the semiconductor body 20, and surrounds the semiconductor body 20 from an outer peripheral side thereof. The core film 50 is provided inside the pipe-like semiconductor body 20. The upper end of the semiconductor body 20 is connected to the bit line BL via the contact portions Cb and V1 as illustrated in FIG. 1.

Figure 3A:
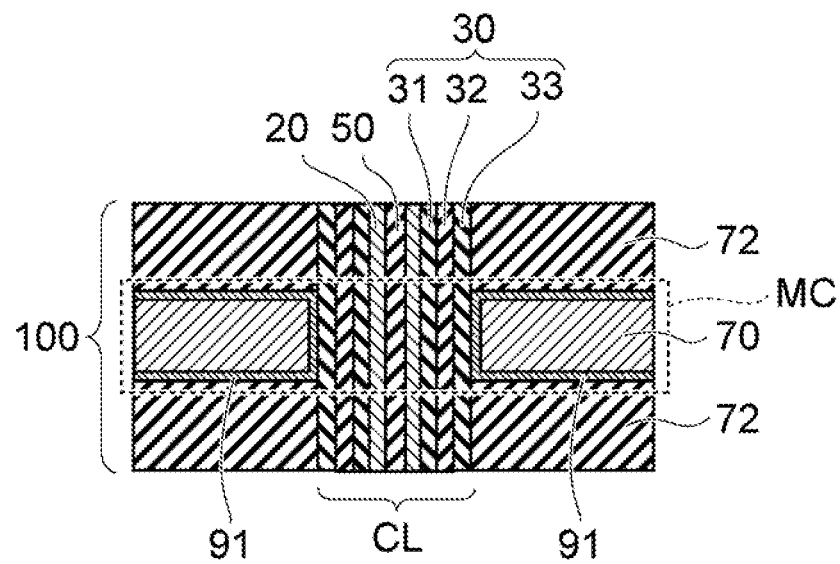
FIGS. 3A and 3B are enlarged views of a section "A" in FIG. 2.

FIG. 3A is an enlarged view of the dashed line outlined portion "A" in FIG. 2.

The memory film 30 is a multi-layer film including a tunnel insulating film 31, a charge storage film 32, and a block insulating film 33. Between the conductive layer 70 and the semiconductor body 20, the block insulating film 33, the charge storage film 32, and the tunnel insulating film 31 are provided in this order from the conductive layer 70 side. The tunnel insulating film 31 contacts the semiconductor body 20. The charge storage film 32 is provided between the block insulating film 33 and the tunnel insulating film 31.

The semiconductor body 20, the memory film 30, and the conductive layer 70 constitute a memory cell MC. In FIG. 3A, one memory cell MC is schematically illustrated by a broken line. The memory cell MC has a vertical transistor structure in which the conductive layer 70 surrounds the semiconductor body 20 via the memory film 30.

In the memory cell MC having the vertical transistor structure, the semiconductor body 20 is, for example, a silicon channel body, and the conductive layer 70 functions as a control gate. The charge storage film 32 functions as a data storing layer that stores charges injected from the semiconductor body 20.

The semiconductor memory device according to the embodiment is a nonvolatile semiconductor memory device that can freely electrically erase and write data and retain storage contents even when the power supply is turned off.

The memory cell MC is, for example, a charge trap type memory cell. The charge storage film 32 includes a large number of trap sites that capture charge in the insulating film and is, for example, a silicon nitride film. Alternatively, the charge storage film 32 may be a conductive floating gate surrounded by an insulator.

The tunnel insulating film 31 functions as a potential barrier when charges are injected into the charge storage film 32 from the semiconductor body 20 or when charges stored in the charge storage film 32 are discharged to the semiconductor body 20. The tunnel insulating film 31 includes a silicon oxide film, for example.

The block insulating film 33 prevents the charge stored in the charge storage film 32 from diffusing into the conductive layer 70. Further, the block insulating film 33 prevents back tunneling of charge from the conductive layer 70 to the columnar portion CL.

A graphene film 91 is provided between the conductive layer 70 and the insulating layer 72 and between the conductive layer 70 and the block insulating film 33 of the columnar portion CL. The graphene film 91 is in contact with the conductive layer 70, the insulating layer 72, and the block insulating film 33.

The graphene film 91 is continuously formed along an upper surface and a lower surface of the respective conductive layers 70 and a side surface of the columnar portion CL. On the side surface of the dividing portion 60 of the stacked body 100 illustrated in FIG. 2, a plurality of graphene films 91 are spaced from each other in the stacking direction and are not connected. Therefore, the different conductive layers 70 are not short-circuited to each other by the graphene film 91.

The graphene film 91 is a honeycomb crystal lattice formed by a sp2 bond of carbon atoms into a hexagonal lattice structure. The thickness of the graphene film 91 may be of a thickness of one carbon atom, or of a thickness of two or more carbon atoms.

As illustrated in FIG. 1, a drain-side select transistor STD is provided at an upper part of the stacked body 100. A source-side select transistor STS is provided at a lower part of the stacked body 100. The uppermost conductive layer 70 functions as a control gate of the drain-side select transistor STD. The lowermost conductive layer 70 functions as a control gate of the source-side select transistor STS.

The plurality of memory cells MC are provided between the drain-side select transistor STD and the source-side select transistor STS. The plurality of memory cells MC, the drain-side select transistor STD, and the source-side select transistor STS are connected in series through the semiconductor body 20, thereby forming one memory string. A plurality of memory strings are spaced from one another in the form of a staggered arrangement, for example, in a plane direction parallel to the XY plane, to form a memory cell, and the plurality of memory cells MC are three-dimensionally provided in the X-direction, the Y-direction, and the Z-direction.

As illustrated in FIG. 1, the interconnect portion LI extends in the X-direction and the Z-direction, and is a film containing a metal, for example. The insulating film 63 is provided on the side surface of the interconnect portion LI as illustrated in FIG. 2. The insulating film 63 is provided between the stacked body 100 and the interconnect portion LI.

The upper end of the interconnect portion LI is connected to the source line SL through a contact portion Cs illustrated in FIG. 1.

A lower end of the interconnect portion LI contacts the substrate 10. Further, the lower end of the semiconductor body 20 contacts the substrate 10. The substrate 10 is, for example, a conductive silicon substrate doped with impurities.

As illustrated in FIG. 2, a semiconductor region 81 is formed on the front surface of the substrate 10 into which the lower end of the interconnect portion LI extends. A plurality of these semiconductor regions 81 are provided, corresponding in number to the plurality of interconnect portion LI. During a read operation, electrons are supplied from the interconnect portion LI to the semiconductor body 20 via the n-type semiconductor region 81 and the substrate 10.

By controlling the potential applied to the lowermost conductive layer 70 provided on the front surface (of the substrate 10 via the insulating film 41, a channel is formed along the front surface of the substrate 10 between the semiconductor region 81 and the lower end of the semiconductor body 20, and thus current can flow between the semiconductor region 81 and the lower end of the semiconductor body 20.

The lowermost conductive layer 70 functions as a control gate for causing the channel to form on the front surface of the substrate 10, and the insulating film 41 functions as a gate insulating film.

According to the embodiment, the graphene film 91 blocks diffusion of elements other than a main component metal contained in the conductive layer 70 into the insulating layer 72 and the columnar portion CL, as will be described below.

A method of manufacturing the semiconductor device according to the embodiment will be described below with reference to FIGS. 4 to 16C.

Figure 4:
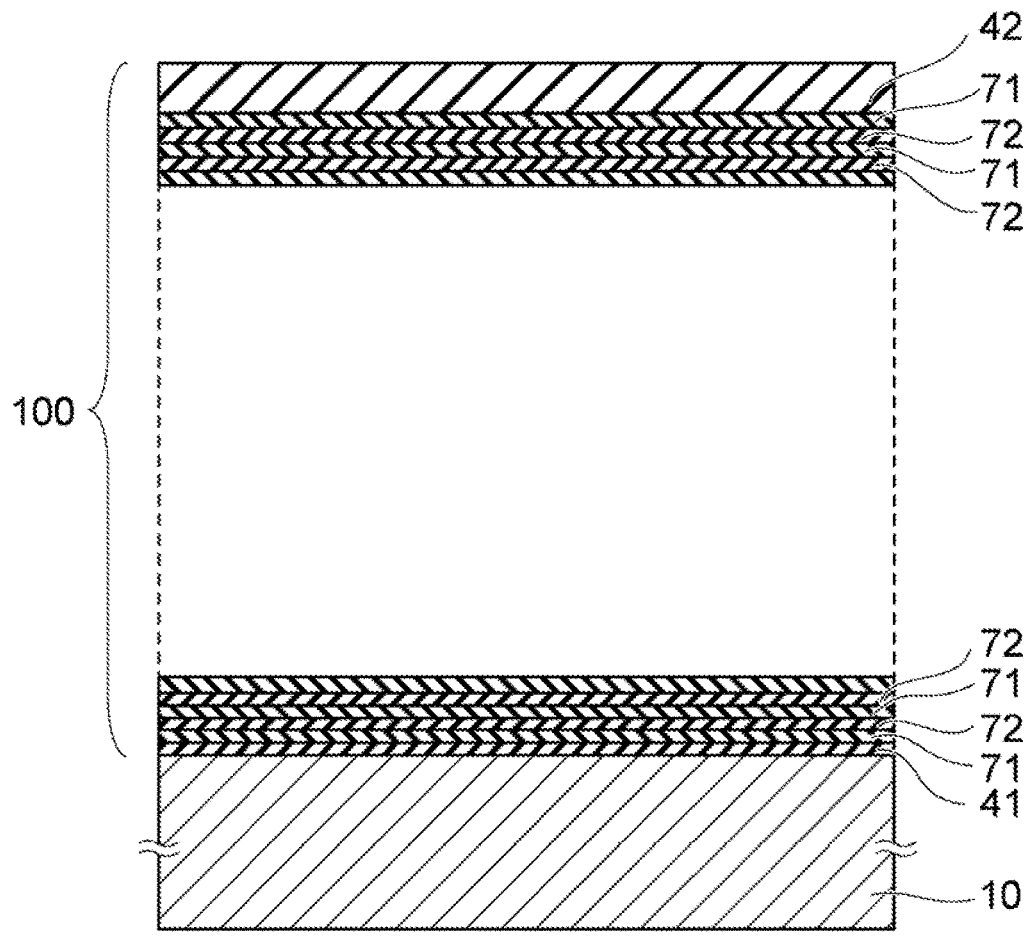
FIG. 4 is a schematic cross-sectional view illustrating a method of manufacturing the semiconductor device according to the embodiment.

As illustrated in FIG. 4, a stacked body 100 is formed on a substrate 10. An insulating film 41 is formed on a main surface of the substrate 10, and a sacrificial layer 71 as a first layer and an insulating layer 72 as a second layer are alternately stacked on the insulating film 41. The process of alternately stacking the sacrificial layer 71 and the insulating layer 72 is repeated, thereby forming a plurality of sacrificial layers 71 and a plurality of insulating layers 72 on the substrate 10 in the Z-direction. For example, the sacrificial layer 71 is a silicon nitride layer, and the insulating layer 72 is a silicon oxide layer.

The lowermost sacrificial layer 71 is formed on the insulating film 41, and the lowermost insulating layer 72 is formed on the lowermost sacrificial layer 71. An insulating film 42 is formed on the uppermost sacrificial layer 71.

Figure 5:
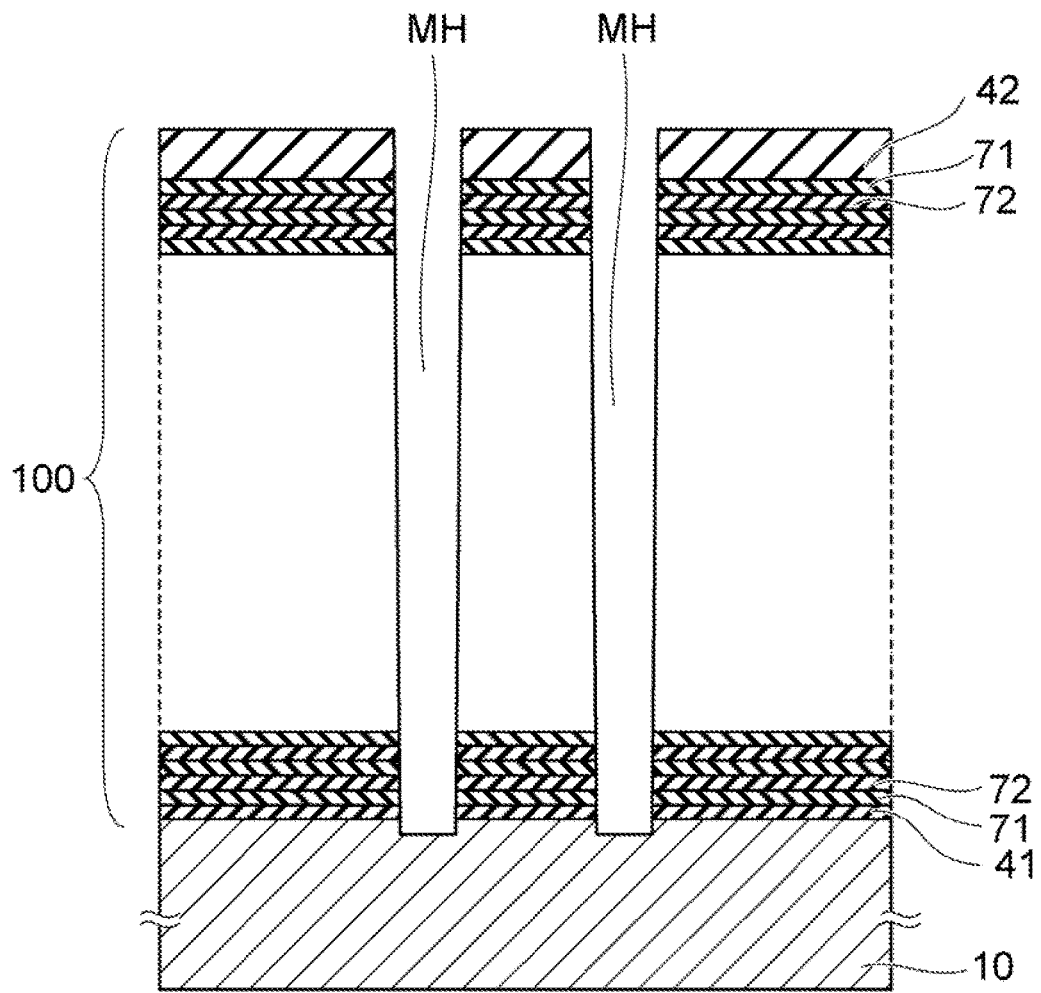
FIG. 5 is a schematic cross-sectional view illustrating a method of manufacturing the semiconductor device according to the embodiment.

Subsequently, as illustrated in FIG. 5, a plurality of memory holes MH are formed in the stacked body 100. The memory holes MH are formed by the reactive ion etching (RIE) method using a mask (not illustrated). The memory hole MH extends in the stacking direction of the stacked body 100 and into the substrate 10.

Figure 6:
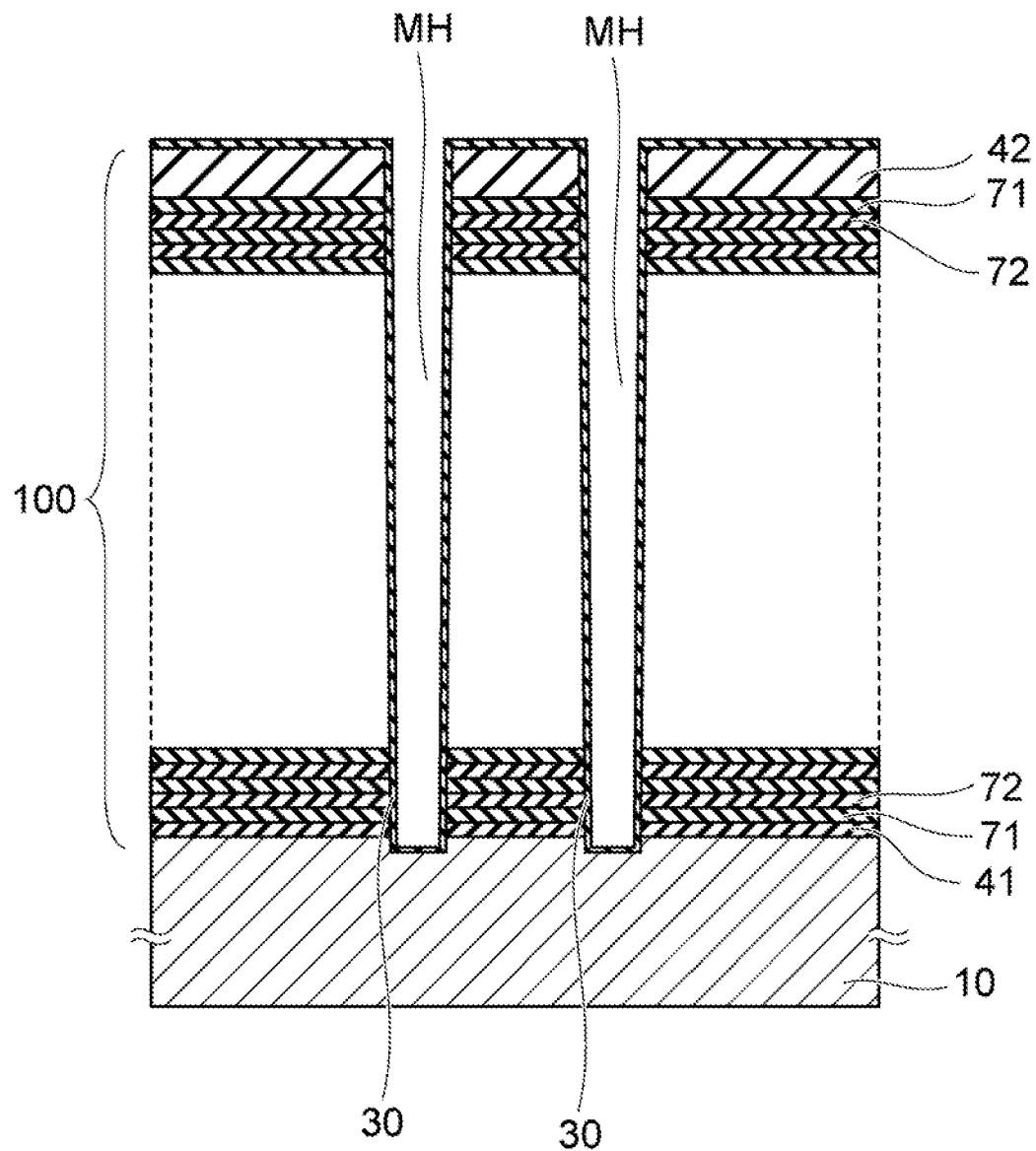
FIG. 6 is a schematic cross-sectional view illustrating a method of manufacturing the semiconductor device according to the embodiment.

As illustrated in FIG. 6, a memory film 30 is formed in the memory hole MH. The memory film 30 is conformally formed along the side surface and bottom of the memory hole MH.

Figure 7:
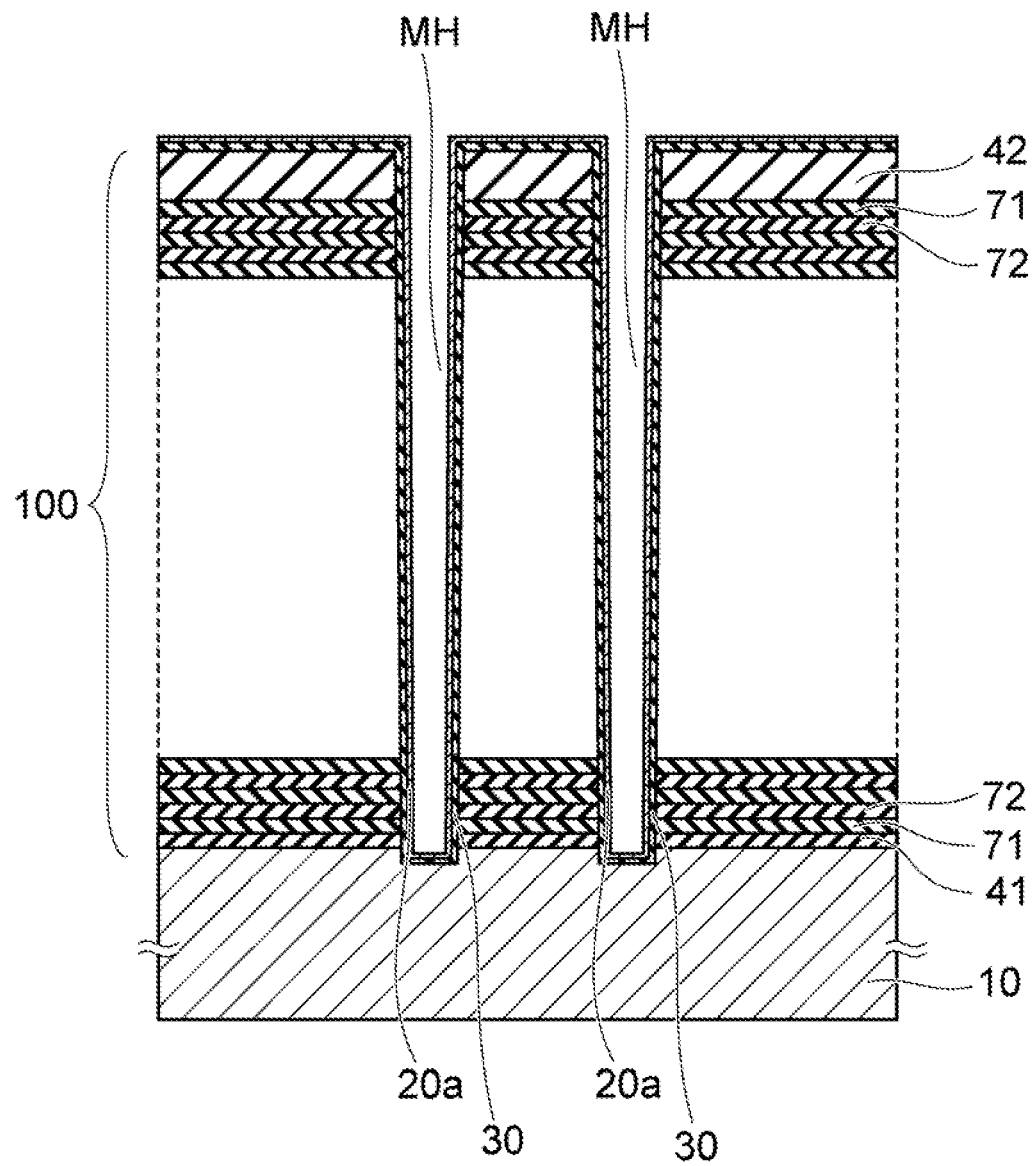
FIG. 7 is a schematic cross-sectional view illustrating a method of manufacturing the semiconductor device according to the embodiment.

As illustrated in FIG. 7, a cover film 20a is formed inside the memory film 30. The cover film 20a is conformally formed along the side surface and bottom of the memory hole MH.

Figure 8:
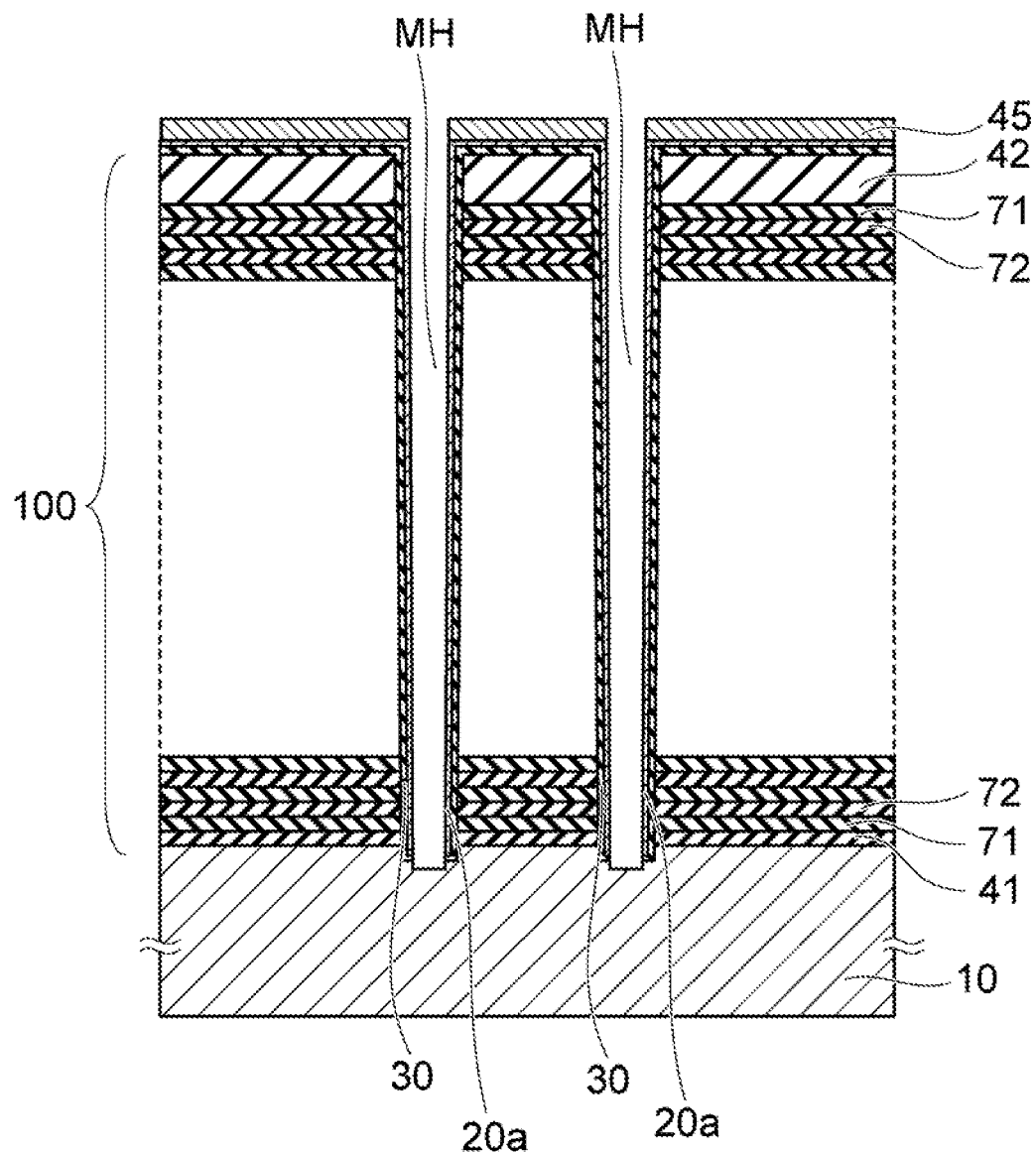
FIG. 8 is a schematic cross-sectional view illustrating a method of manufacturing the semiconductor device according to the embodiment.

Then, as illustrated in FIG. 8, a mask layer 45 is formed on the upper surface of the stacked body 100, and the cover film 20a and the memory film 30 deposited on the bottom of the memory hole MH are removed by etching by the RIE method. In the RIE method, the memory film 30 formed on the side surface of the memory hole MH is covered with the cover film 20a to be protected, thereby undergoing no damage by RIE.

Figure 9:
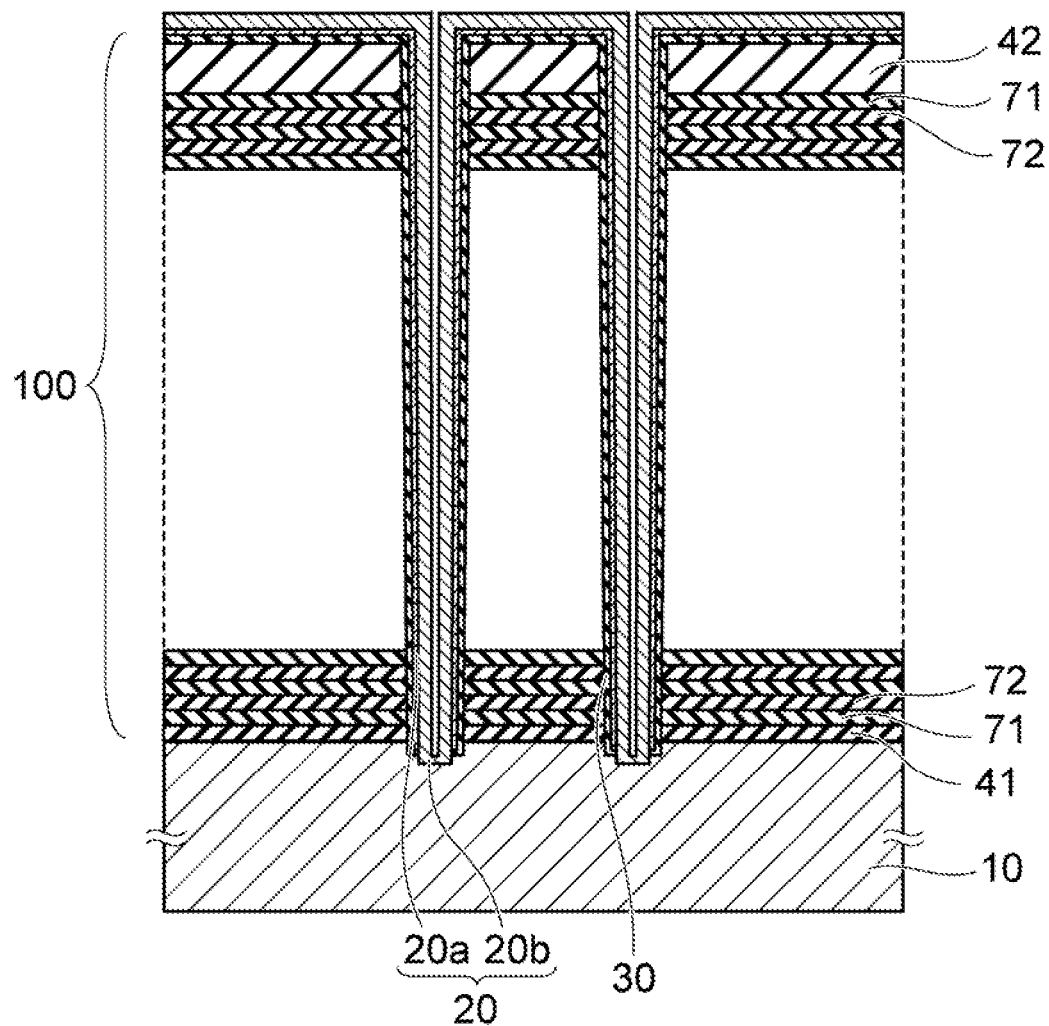
FIG. 9 is a schematic cross-sectional view illustrating a method of manufacturing the semiconductor device according to the embodiment.

After the mask layer 45 is removed, as illustrated in FIG. 9, a semiconductor film 20b is formed in the memory hole MH. The semiconductor film 20b is formed on the side surface of the cover film 20a and the bottom of the memory hole MH from which the substrate 10 is exposed.

After being formed as, for example, an amorphous silicon film, the cover film 20a and the semiconductor film 20b are crystallized into a polycrystalline silicon film by heat treatment. The cover film 20a and the semiconductor film 20b constitute the above-described semiconductor body 20.

Figure 10:
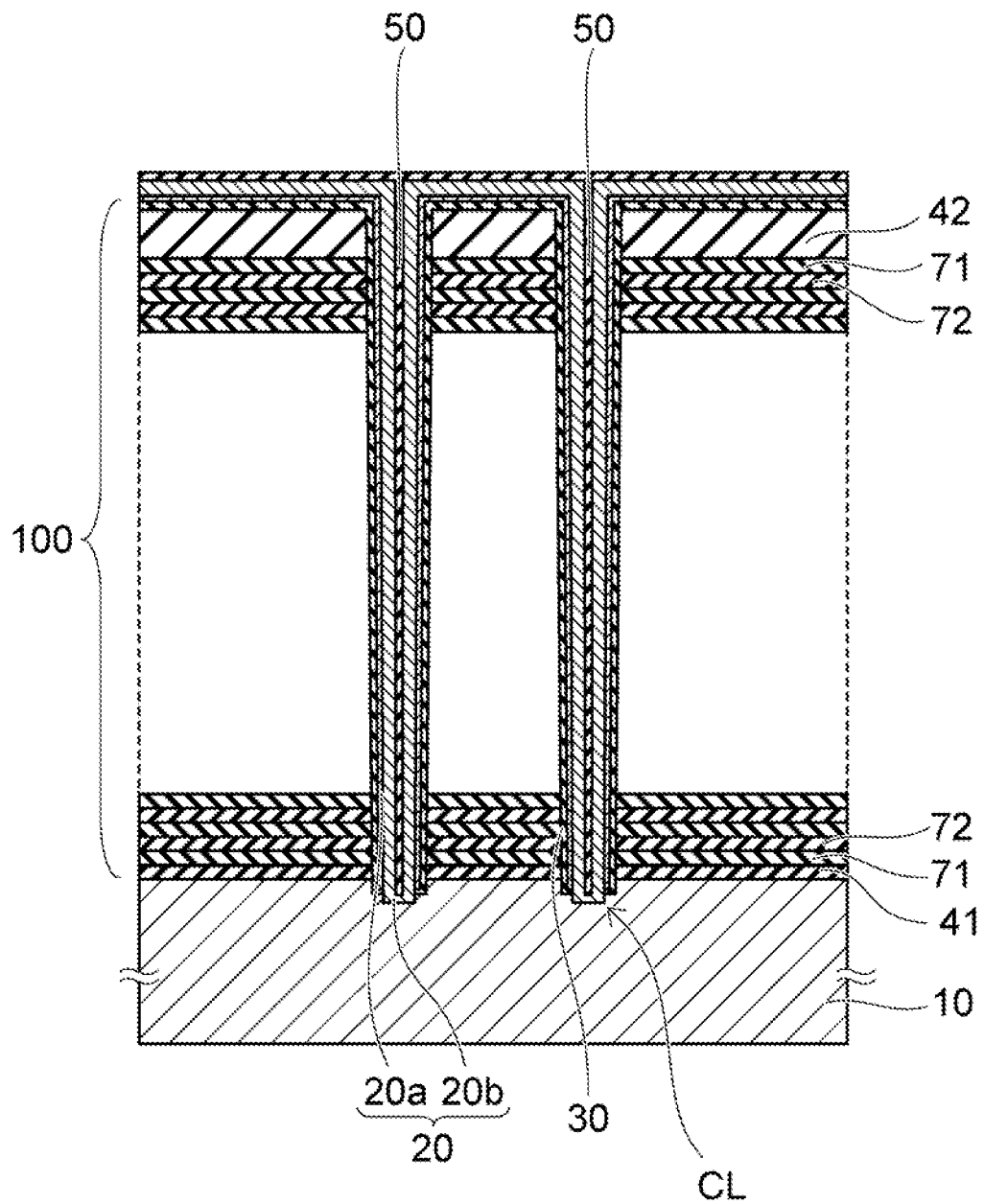
FIG. 10 is a schematic cross-sectional view illustrating a method of manufacturing the semiconductor device according to the embodiment.

As illustrated in FIG. 10, a core film 50 is formed inside the semiconductor film 20b. A plurality of columnar portion CL including the memory film 30, the semiconductor body 20, and the core film 50 are formed in the stacked body 100.

Figure 11:
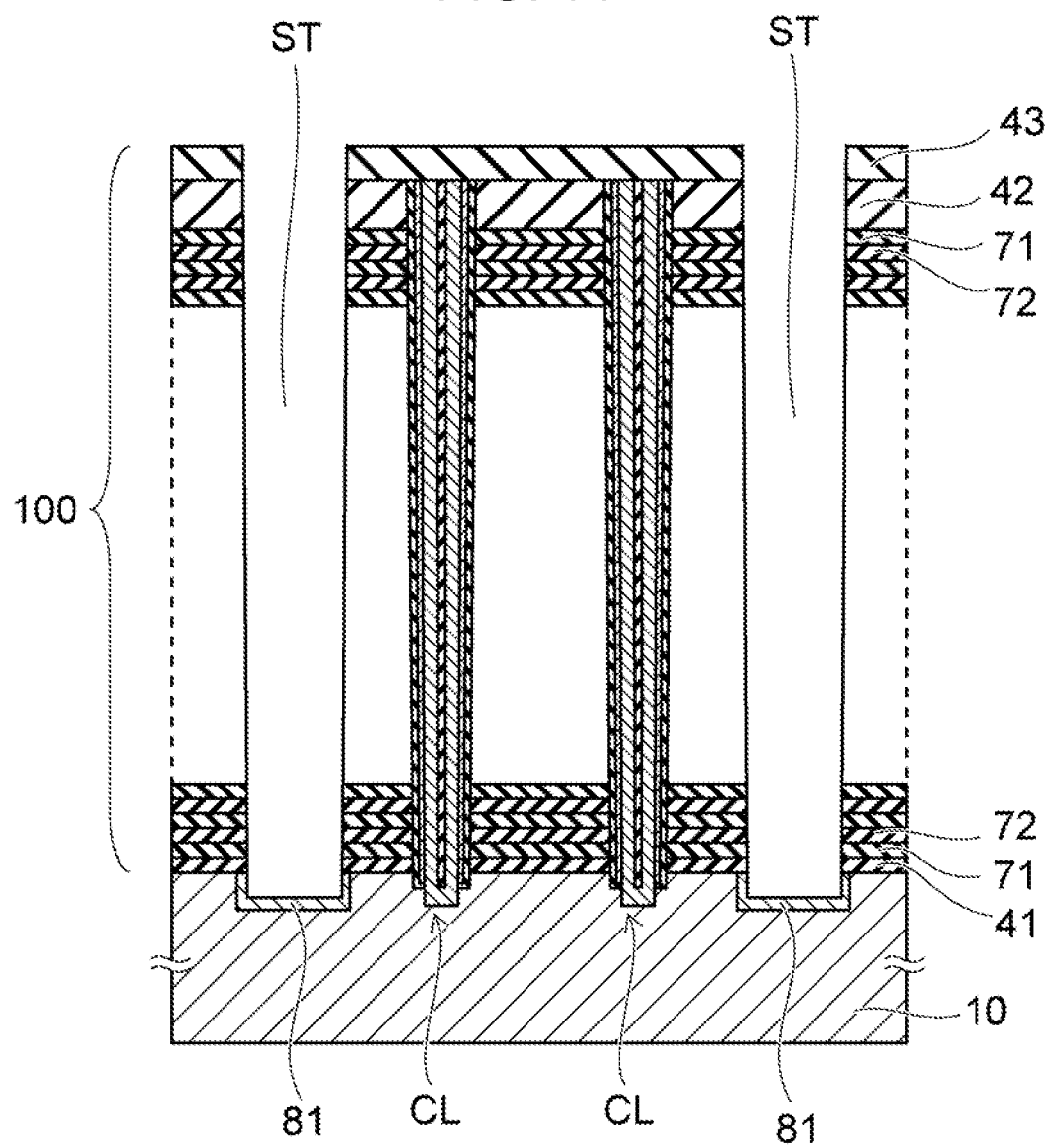
FIG. 11 is a schematic cross-sectional view illustrating a method of manufacturing the semiconductor device according to the embodiment.

The respective films deposited on the insulating film 42 illustrated in FIG. 10 are removed by chemical mechanical polishing (CMP) or etch back. Thereafter, as illustrated in FIG. 11, an insulating film 43 is formed on the insulating film 42. The insulating film 43 covers the upper end of the columnar portion CL.

Then, a plurality of slits ST extending in the stacking direction are formed in the stacked body 100. The plurality of slits ST are formed in the stacked body 100 including the insulating film 43, the insulating film 42, the insulating layer 71, the insulating layer 72, and the insulating film 41, by the RIE method using a mask (not illustrated). The slit ST penetrates through the stacked body 100 and into the substrate 10.

Impurities (e.g., dopants) are implanted into the substrate 10 in the region exposed at the bottom of the slit ST by ion implantation, and a semiconductor region 81 is formed on the front surface of the substrate 10 at the bottom of the slit ST.

Subsequently, the sacrificial layer 71 is removed by an etching solution or an etching gas supplied through the slit ST. For example, the silicon nitride sacrificial layer 71 is removed using an etching solution containing phosphoric acid.

Figure 12:
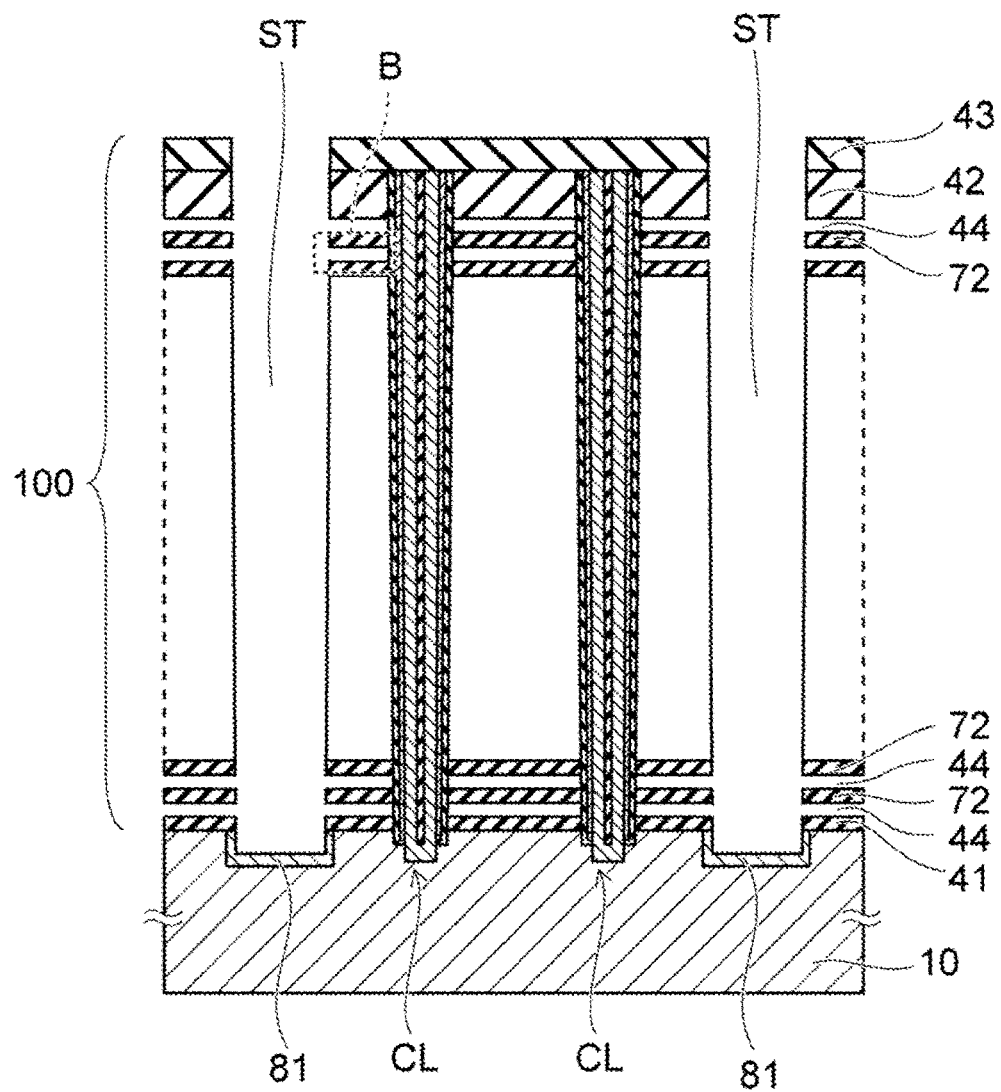
FIG. 12 is a schematic cross-sectional view illustrating a method of manufacturing the semiconductor device according to the embodiment.

When the sacrificial layer 71 is removed, a gap 44 is formed between the insulating layers 72 adjacent to each other in a vertical direction as illustrated in FIG. 12. The gap 44 is also formed between the insulating film 41 and the lowermost insulating layer 72 and between the uppermost insulating layer 72 and the insulating film 42.

The plurality of insulating layers 72 are supported by their connection to the columnar portion CL. The insulating layers 72 are spaced from each other in the stacking direction by the gaps 44. The lower end of the columnar portion CL is supported by the substrate 10, and the upper end thereof is supported by the insulating film 42 and the insulating film 43.

Figure 15A:
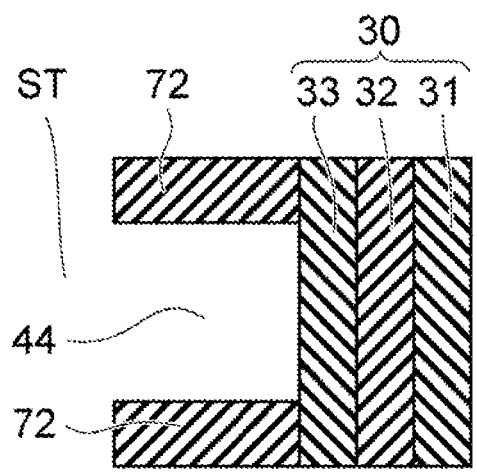
FIGS. 15A to 15C are schematic cross-sectional views illustrating a method of manufacturing the semiconductor device according to the embodiment.

FIG. 15A is an enlarged view of the dashed outline section B of FIG. 12.

As illustrated in FIG. 15A, the upper surface and the lower surface of adjacent insulating layers 72 are exposed to the gap 44. Further, the side surface of the block insulating film 33 of the memory film 30 is exposed to the gap 44.

Figure 15B:
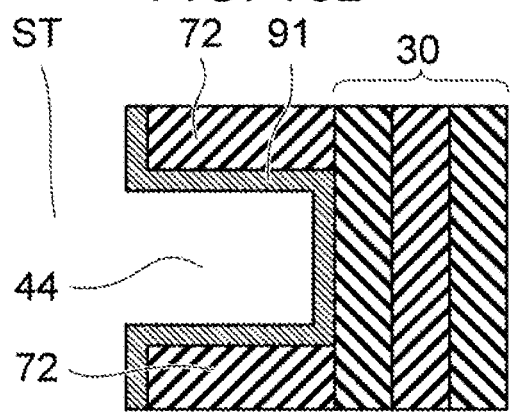

As illustrated in FIG. 15B, a graphene film 91 is formed on an inner wall (the upper surface and the lower surface of the insulating layer 72 and the side surface of the block insulating film 33) of the gap 44. The graphene film 91 is formed by, for example, chemical vapor deposition (CVD) using a raw material gas containing a hydrocarbon.

The graphene film 91 is conformally and continuously formed along the upper surface and lower surface of the insulating layers 72 facing each other across the gap 44, along the side surface of the block insulating film 33 facing the gap 44, and along the side surfaces of the insulating layer 72 on the slit ST side.

Figure 15C:
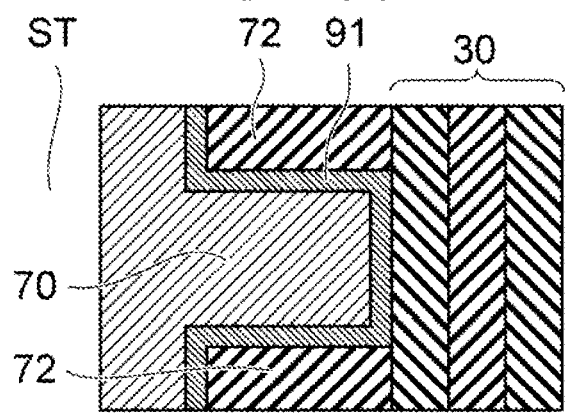

After the graphene film 91 is formed, the gap 44, reduced in size, remains between the graphene film 91 formed on the insulating layers 72 facing each other in the vertical direction. As illustrated in FIG. 15C, a conductive layer 70 is then formed in the gap 44. The conductive layer 70 may be directly formed on the surface of the graphene film 91, or the conductive layer 70 may be formed on the surface of a film suitable for growth of the conductive layer 70 (e.g., a tungsten layer or a molybdenum layer) formed on the graphene film 91).

As an example of the conductive layer 70, a tungsten layer or a molybdenum layer is formed by CVD. The cvd gas enters the gap 44 through the slit ST.

A process of forming the tungsten layer as an example of the conductive layer 70 using CVD includes a step of forming an initial tungsten film having a small, or a micro, crystalline grain size on the graphene film 91 and a step of forming a tungsten layer having a large grain size over the initial film and having a thickness thicker than the initial film.

For example, the initial film is formed by reaction of tungsten fluoride ($WF_6$), which is a source gas of tungsten, and diborane ($B_2H_6$) as a reducing gas. Thereafter, the tungsten layer is formed inside the initial film by reaction of the $WF_6$ and hydrogen ($H_2$) as a reducing gas.

Similarly, in the case of forming the molybdenum layer as the conductive layer 70, for example, an initial film of molybdenum is formed using molybdenum fluoride ($MoF_6$) and diborane ($B_2H_6$), and then the thicker overlying molybdenum layer is formed using $MoF_6$ and hydrogen ($H_2$).

The initial film formed on the surface of the graphene film 91 composed of tungsten or molybdenum is formed as a transition layer so the crystal or grain structure of the overlying thicker tungsten or molybdenum layer and the crystal or grain structure of the graphene film 91 can be different. Therefore, the crystal structure of the graphene film 91 does not affect the crystal structure of the conductive layer 70. This allows the grain size of the overlying thicker tungsten or molybdenum layer to be large due to the $H_2$ reduction reaction with the $WF_6$, and thus results in a lower resistance the conductive layer 70.

The conductive layer (e.g., tungsten layer or molybdenum layer) 70 formed by the CVD contains fluorine and boron in addition to the main component metal (e.g., tungsten or molybdenum). In a later step involving heat treatment after forming the conductive layer 70, the fluorine (F) contained in the conductive layer 70 can diffuse into the insulating layer 72 or the columnar portion CL. The fluorine can etch the insulating layer 72 or the insulating film of the columnar portion CL.

According to the embodiment, the graphene film 91 blocks the diffusion of the fluorine from the conductive layer 70 to the insulating layer 72 and the diffusion of the fluorine from the conductive layer 70 to the columnar portion CL. This prevents characteristic deterioration of the insulating layer 72 and the columnar portion CL.

In addition, the graphene film 91 blocks diffusion of oxygen in the insulating layer 72 and oxygen in the block insulating film 33 into the conductive layer 70. This prevents a resulting increase in the resistance of the conductive layer 70 and enables high-speed operation and low power consumption of the memory cell array 1.

Graphene is a hexagonal (six sided) lattice structure which provides high blocking, i.e., diffusion barrier, properties against the passage of molecules and atoms therethrough. A monolayer or single atom thick layer graphene film 91 has a thickness of 0.34 nm, and such a monolayer of graphene film 91 provides a sufficient barrier to O and F migration therethrough.

By providing a thin graphene film 91, it is possible to provide a relatively thicker conductive layer 70 or to reduce the thickness of the stacked body 100. Thickening the conductive layer 70 lowers the resistance of the conductive layer 70. The reduction in the thickness of the stacked body 100 lowers the difficulty of forming the holes MH and slits ST.

Depending on the thickness of the conductive layer 70 and the number of the plurality of conductive layers 70, the thickness of the graphene film 91 is preferably 3 nm or less.

The conductive layer 70 also contains boron due to the use of a boron containing reducing gas as described above, and the graphene film 91 is also effective for preventing diffusion of the boron into the insulating layer 72 and the columnar portion CL.

Figure 16A:
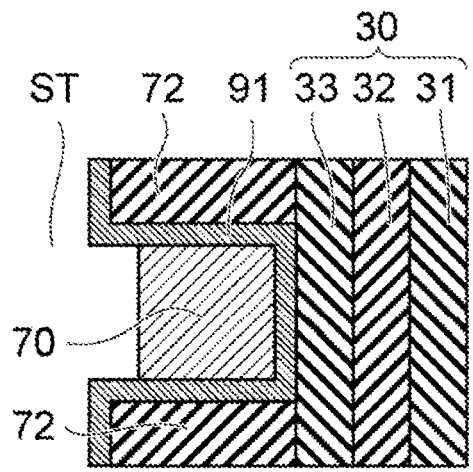
FIGS. 16A to 16C are schematic cross-sectional views illustrating a method of manufacturing the semiconductor device according to the embodiment.

As illustrated in FIG. 15C, the conductive layer 70 is also formed on the side surface of the slit ST. The conductive layer 70 formed on the side surfaces of the slit ST is removed by an etching solution or an etching gas supplied into the slit ST, with the result as illustrated in FIG. 16A. By the removal of the conductive layer 70 on the side surfaces of the slit, the electrical connection between the conductive layers 70 adjacent to each other in the vertical direction is eliminated.

When the conductive layer 70 on the side surface of the slit ST is removed, the graphene film 91 formed along the side surface of the insulating layer 72 is exposed within the slit ST. This portion of the graphene film 91 is removed by, for example, an etching gas containing oxygen supplied to the slit ST.

Figure 13:
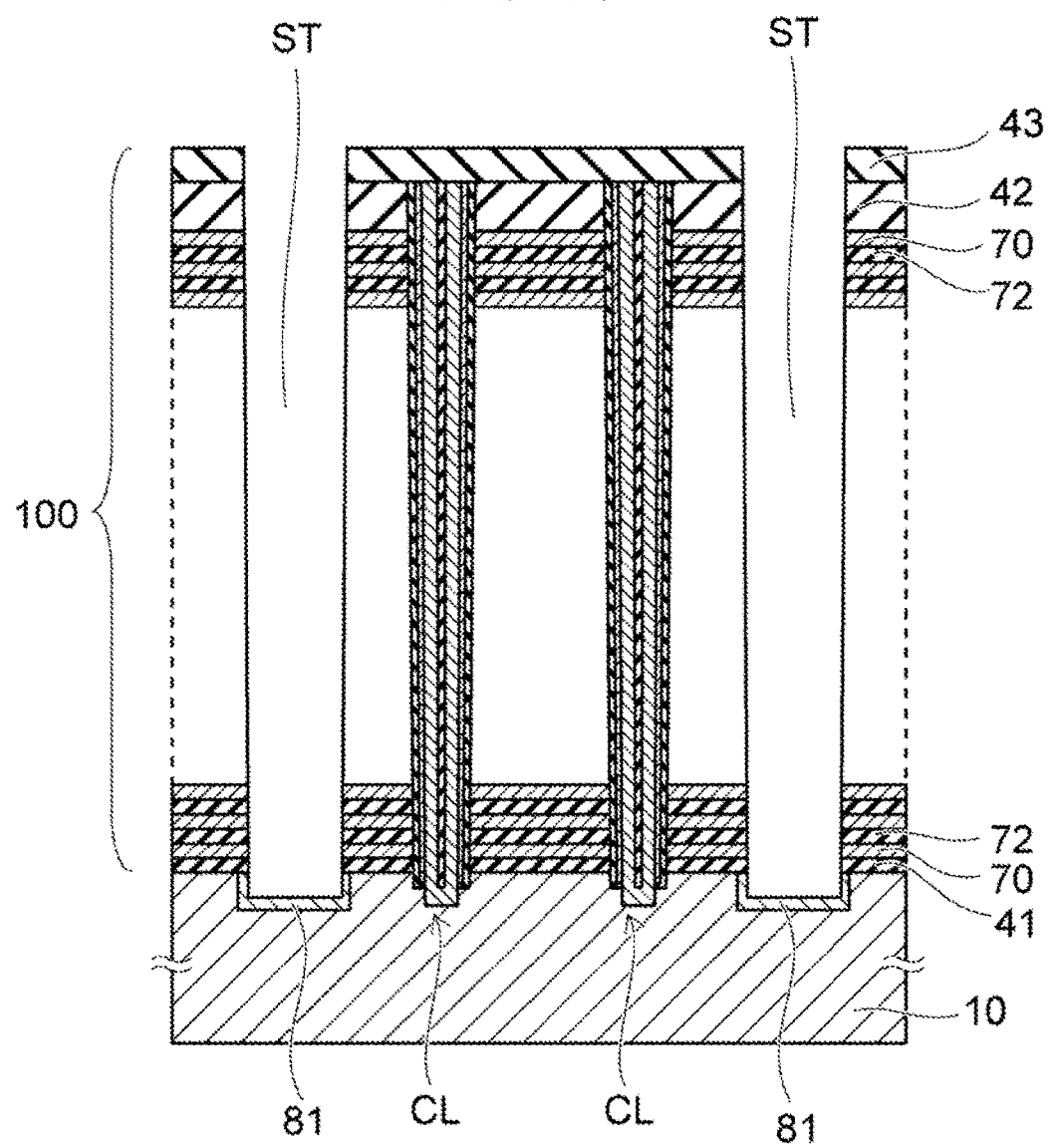
FIG. 13 is a schematic cross-sectional view illustrating a method of manufacturing the semiconductor device according to the embodiment.
Figure 16B:
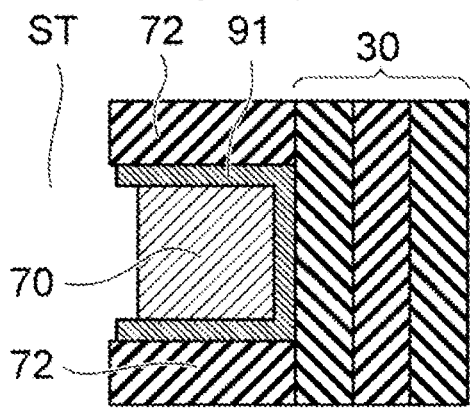

The removal of the graphene film 91 on the side surface of the slit ST eliminates the electrical connection, through the graphene film 91, between the conductive layers 70 adjacent to each other in the vertical direction, as illustrated in FIGS. 16B and 13.

Figure 14:
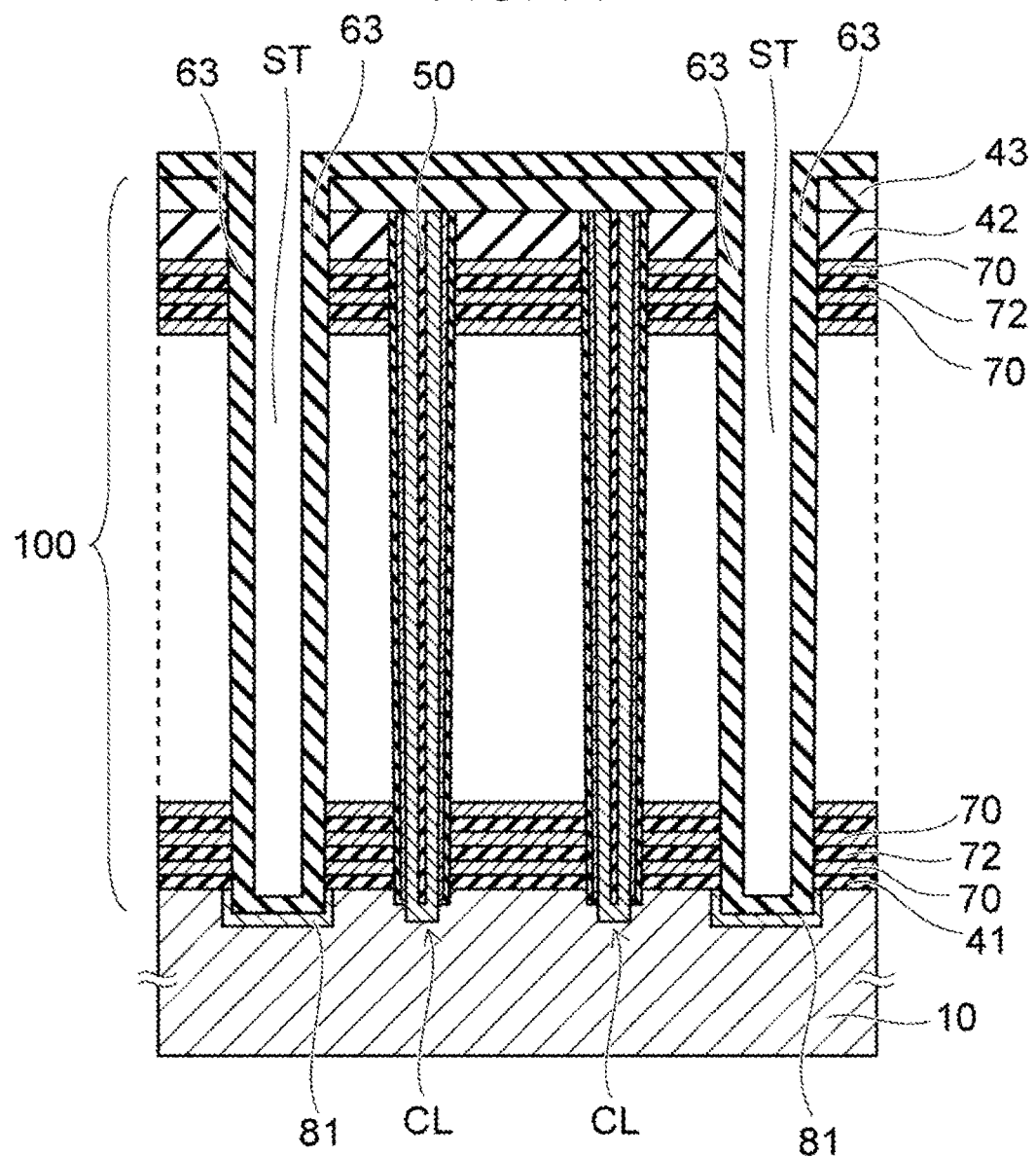
FIG. 14 is a schematic cross-sectional view illustrating a method of manufacturing the semiconductor device according to the embodiment.
Figure 16C:
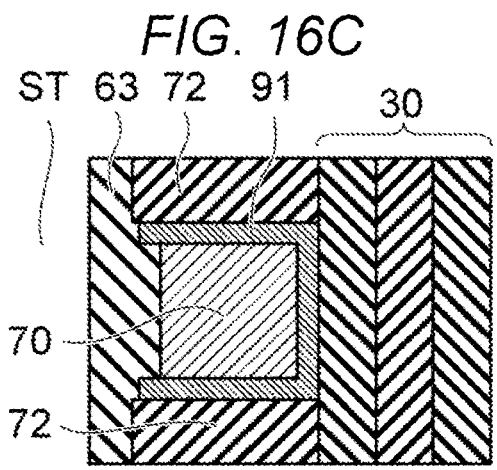

Thereafter, as illustrated in FIGS. 16C and 14, an insulating film 63 is formed on the side surface and the bottom of the slit ST. The insulating film 63 is a silicon oxide film or a silicon nitride film.

The insulating film 63 formed on the bottom of the slit ST is removed by a RIE method, and then an interconnect portion LI is embedded inside the insulating film 63 in the slit ST as illustrated in FIG. 2. The lower end of the interconnect portion LI is connected to the substrate 10 through the semiconductor region 81. Then, for example, the bit line BL and the source line SL are formed as illustrated in FIG. 1.

Another method of forming the graphene film 31 will be described below with reference to FIGS. 17A to 17C.

Figure 17A:
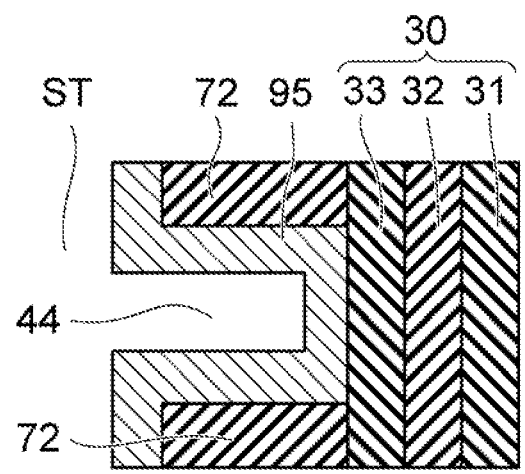
FIGS. 17A to 17C are schematic cross-sectional views illustrating a method of manufacturing the semiconductor device according to the embodiment.
Figure 17B:
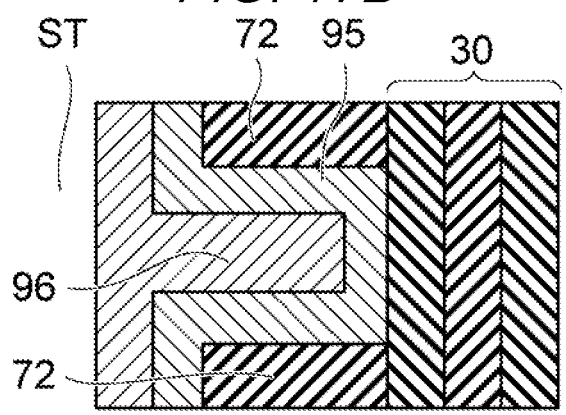
Figure 17C:
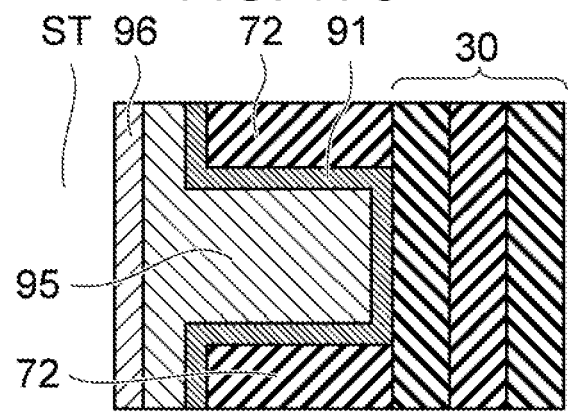

After the process resulting in the structure illustrated in FIG. 15A, a catalyst metal 95 is formed on the inner wall (the upper surface and the lower surface of the insulating layer 72 and the side surface of the block insulating film 33) of the gap 44, as illustrated in FIG. 17A. The catalyst metal 95 is conformally and continuously formed along the surface (upper surface and lower surface) of the insulating layer 72 facing the gap 44, the side surface of the block insulating film 33 facing the gap 44, and the side surface of the insulating layer 72 on the side wall of the slit ST.

The catalyst metal 95 is formed by CVD or plating, for example. The catalyst metal 95 is, for example, copper, nickel, cobalt, iron, ruthenium, iridium, an alloy containing at least one of them, or a metal silicide.

A reduced thickness gap 44 remains inside the catalyst metal 95 between the insulating layers 72 adjacent to each other in the vertical direction. As illustrated in FIG. 17B, a carbon film (e.g., amorphous carbon or organic film) 96 is formed in the gap 44. The carbon film 96 is formed by CVD or plating, for example.

Then, annealing is performed. As a result of the annealing, carbon of the carbon film 96 is dissolved in the catalyst metal 95 as a solid solution, and the graphene film 91 is deposited on the interface between the catalyst metal 95 and the insulating layer 72 and the interface between the catalyst metal 95 and the block insulating film 33, as illustrated in FIG. 17C.

The carbon film 96 formed on the side surfaces of the slit ST is removed by, for example, an etching gas containing oxygen, and then the catalyst metal 95 is removed by dry etching or wet etching. Thereafter, the above-described steps illustrated in FIGS. 15B to 16C are continued.

Figure 18A:
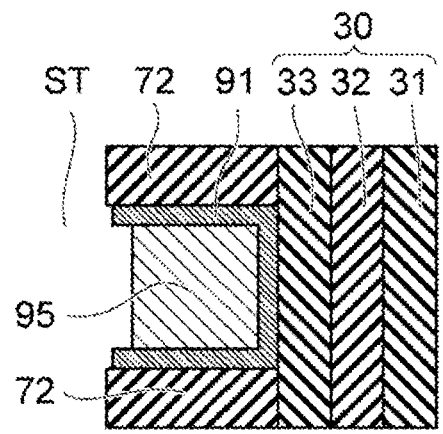
FIGS. 18A and 18B are schematic cross-sectional views illustrating a method of manufacturing the semiconductor device according to the embodiment.
Figure 18B:
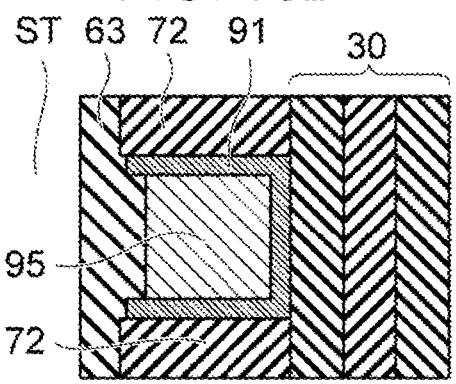

Alternatively, after the carbon film 96 on the side surface of the slit ST is removed, the catalyst metal 95 may remain inside the graphene film 91 between the insulating layers 72 adjacent to each other in the vertical direction as illustrated in FIG. 18A, without being completely removed. The catalyst metal 95 formed on the side surface of the slit ST is removed. Then, as illustrated in FIG. 18B, the insulating film 63 is formed on the side surface of the slit ST.

The catalyst metal 95 remaining between the insulating layers 72 is used as the conductive layer 70. In this case, the catalyst metal 95 is desirably a refractory metal (for example, ruthenium or iridium) having heat-resistant processability in later steps.

Figure 3B:
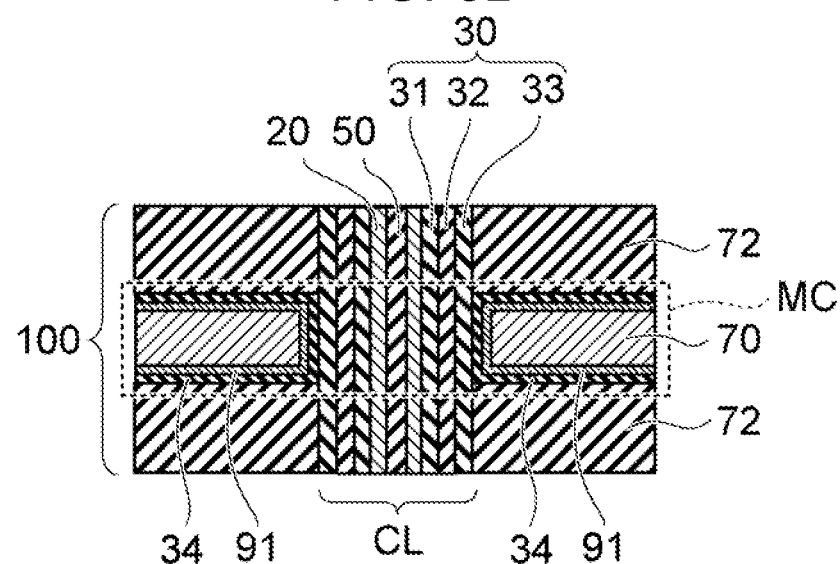

FIG. 3B is schematic cross-sectional view similar to FIG. 3A.

To improve the characteristics of the memory cell MC, a metal oxide film 34 may be formed between the conductive layer 70 and the memory film 30. The metal oxide film 34 is provided between the graphene film 91 and the insulating layer 72 and between the graphene film 91 and the block insulating film 33. The metal oxide film 34 is an aluminum oxide film, for example.

The metal oxide film 34 is conformally formed along the inner wall of the gap 44 before the graphene film 91 is formed after the gap 44 is formed as illustrated in FIG. 15A. At this time, the metal oxide film 34 is also formed on the side surface of the slit ST. The insulating metal oxide film 34 may remain on the side surface of the slit ST.

Instead of the metal oxide film 34, a metal film such as a titanium film may be formed between the graphene film 91 and the insulating layer 72 and between the graphene film 91 and the block insulating film 33. In this case, the metal film formed on the side surface of the slit ST is removed.

Figure 19:
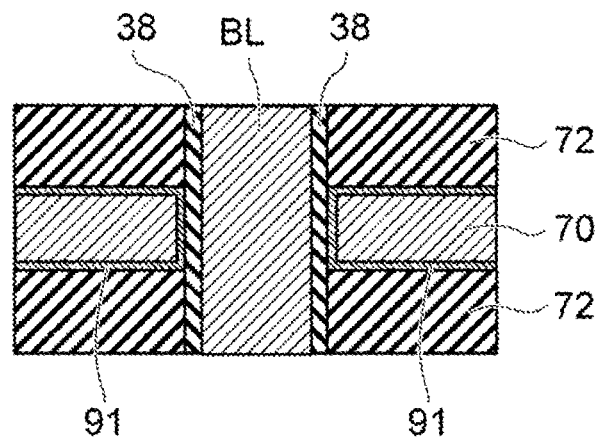
FIG. 19 is a schematic cross-sectional view of a semiconductor device according to another embodiment.

FIG. 19 is a schematic cross-sectional view similar to FIG. 3A.

FIG. 19 illustrates apart of a resistance change memory having a vertical bit line structure.

The stacked body having the plurality of conductive layers 70 and the plurality of insulating layers 72 is provided on the substrate as an example of the under layer, and the columnar bit line BL penetrates through the stacked body in the stacking direction. The bit line BL and the conductive layer 70 intersect each other. A resistance change film 38 is formed on the side surface of the columnar bit line BL. The bit line BL and the resistance change film 38 constitute a columnar portion.

The resistance change film 38 is provided between the bit line BL and the conductive layer 70 at the intersection between the conductive layer 70 and the bit line BL. The resistance change film 38 can be electrically switched between a state where resistance is relatively low (an off state) and a state where resistance is relatively high (a reset state), to store data in a nonvolatile manner.

The graphene film 91 is provided between the resistance change film 38 and the conductive layer 70. The graphene film is provided between the conductive layer 70 and the insulating layer 72.

Even in the structure illustrated in FIG. 19, the graphene film 91 blocks the diffusion of elements other than the main component metal of the conductive layer 70 from the conductive layer 70 to the insulating layer 72 and the diffusion of the elements from the conductive layer 70 to the resistance change film 38.

The conductive layer 70 preferably contains a material which is difficult to aggregate by heat treatment at 600° C. or higher. For example, the conductive layer 70 contains at least one metal selected from the group consisting of tungsten, molybdenum, nickel, cobalt, iron, ruthenium, and iridium. An example of the conductive layer 70 may include a tungsten layer, a molybdenum layer, a nickel layer, a nickel silicide layer, a cobalt layer, an iron layer, a ruthenium layer, or an iridium layer. In addition, the conductive layer 70 may be formed by the plating in addition to the CVD.

According to the semiconductor device of the embodiment, the columnar portion includes the semiconductor body extending in the stacking direction, and the charge storage portion provided between the semiconductor body and the conductive layer.

According to the semiconductor device of the embodiment, the columnar portion further includes the first insulating film provided between the semiconductor body and the charge storage portion, and the second insulating film provided between the charge storage portion and the conductive layer.

According to the semiconductor device of the embodiment, the columnar portion includes the bit line extending in the stacking direction, and the resistance change film provided between the bit line and the conductive layer.

According to the method of manufacturing the semiconductor device of the embodiment, the first layer is removed by the etching through the slit penetrating the stacked body, and the gap communicating with the slit is formed.

According to the method of manufacturing the semiconductor device of the embodiment, the first layer is the silicon nitride layer, and the second layer is the silicon oxide layer.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A semiconductor device comprising:
an under layer;

a stacked body comprising a plurality of alternating conductive layers and insulating layers stacked one over the other in a stacking direction, above the under layer;

a columnar portion extending into the stacked body in the stacking direction of the stacked body; and a graphene film between at least one of the conductive layers and adjacent insulating layers and between the at least one of the conductive layers and the columnar portion.

2. The semiconductor device according to claim 1, wherein each of the conductive layers contains at least one metal selected from the group consisting of tungsten, molybdenum, nickel, cobalt, iron, ruthenium, and iridium.

3. The semiconductor device according to claim 1, wherein each of the conductive layers contains fluorine.

4. The semiconductor device according to claim 1, further comprising a metal oxide film provided between the graphene film and the insulating layer and between the graphene film and the columnar portion.

5. The semiconductor device of claim 1, wherein the graphene film is one monolayer thick.

6. The semiconductor device of claim 1, wherein the columnar portion extends through the stacked body.

7. The semiconductor device of claim 1, wherein the graphene film is between each one of the conductive layers and adjacent insulating layers and between said each one of the conductive layers and the columnar portion.

* * * * *